United States Patent [19]

McFadyen et al.

[11] 4,034,298
[45] July 5, 1977

[54] CASCODE FM TUNER FOR A RADIO RECEIVER

[75] Inventors: Robert J. McFadyen, Syracuse; William Peil, North Syracuse, both of N.Y.

[73] Assignee: General Electric Company, Syracuse, N.Y.

[22] Filed: Oct. 17, 1975

[21] Appl. No.: 623,372

[52] U.S. Cl. .............................. 325/318; 325/418; 331/8
[51] Int. Cl.[2] .......................................... H04B 1/16
[58] Field of Search ........... 325/318, 319, 418–420; 329/101, 136, 150, 178; 330/20, 22; 331/1 R, 175, 8

[56] References Cited

UNITED STATES PATENTS

| | | | |
|---|---|---|---|
| 3,586,887 | 6/1971 | Ziel et al. ........................... | 325/318 |
| 3,671,884 | 6/1972 | Denny, Jr. ......................... | 325/318 |
| 3,673,498 | 6/1972 | Harford .............................. | 325/319 |

OTHER PUBLICATIONS

McGraw Hill Encyclopedia of Science and Technology, 1971, p. 563.

*Primary Examiner*—Robert L. Griffin
*Assistant Examiner*—Aristotelis M. Psitos
*Attorney, Agent, or Firm*—Richard V. Lang; Carl W. Baker; Frank L. Neuhauser

[57] ABSTRACT

An FM tuner having an improved automatic frequency control circuit and designed for use in an AM-FM receiver is described. The tuner employs a mixer transistor and an oscillator transistor connected in circuit so that they form a single series path across the bias source. This feature permits one to control conduction in both transistors by control of one and thus simplifies both biasing and mode conversion. Preferably, the transistor bias source and the source of AFC control potential are consolidated to save decoupling components. When the base of the mixer transistor is connected to the source through a low d.c. impedance, the AFC potential is transferred (less the mixer junction drop) to the collector of the oscillator transistor, where it provides sensitive automatic frequency control action. The circuit design uses a minimum of components.

9 Claims, 1 Drawing Figure

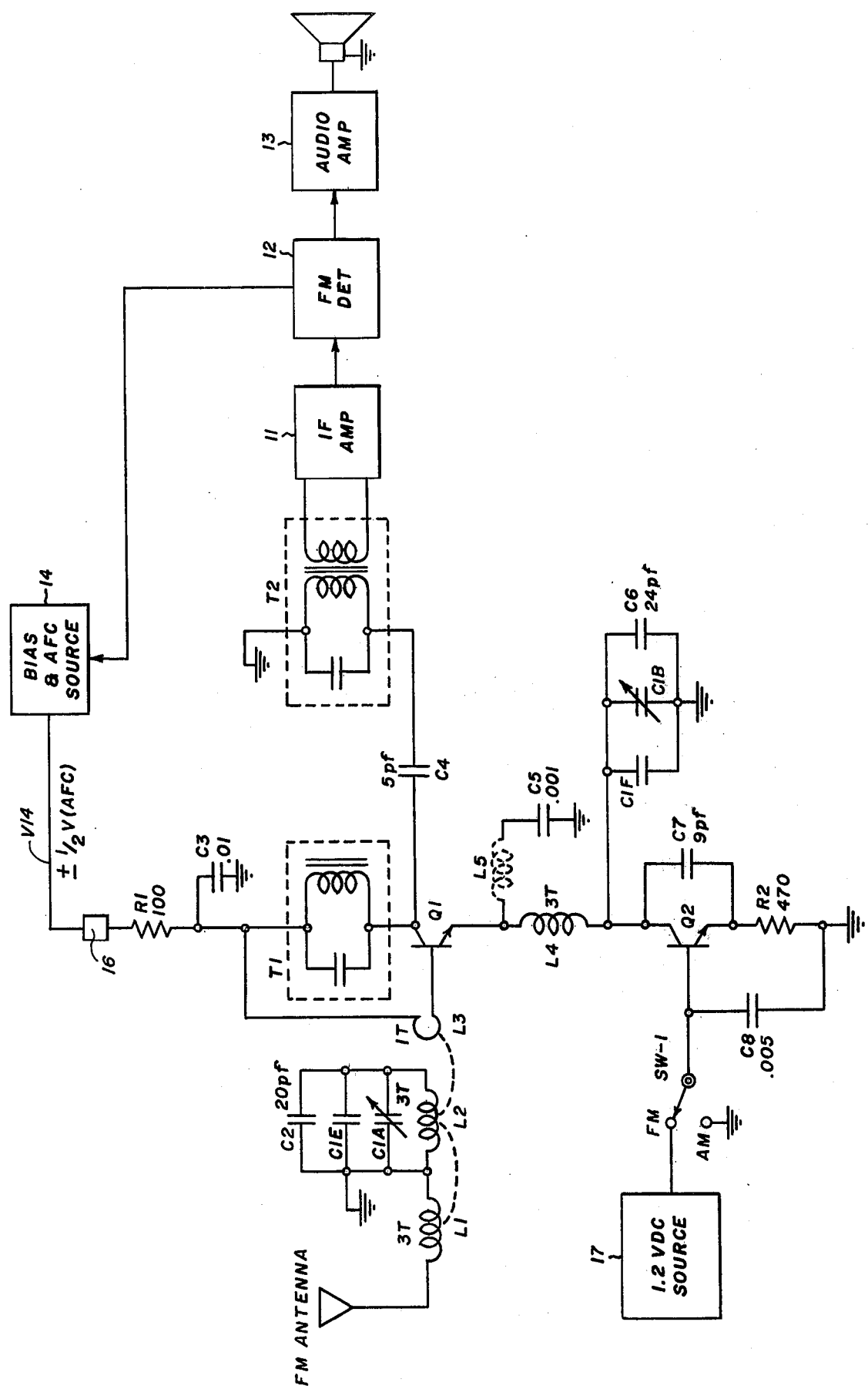

CASCODE FM TUNER FOR A RADIO RECEIVER

BACKGROUND OF THE INVENTION

1. Field of the Invention

The present invention relates to tuners in which a signal is combined with a local oscillation to form a heterodyne frequency at a given intermediate frequency. The invention also relates to circuits wherein automatic frequency control of the oscillator frequency is provided to avoid drift.

2. Description of the Prior Art

A turner for converting signals lying over a band of frequencies to a fixed intermediate frequency typically comprises a mixer circuit and an oscillator circuit, both of which are tuned in synchronism and an output circuit for selecting the heterodyne at the desired fixed, intermediate output frequency. In the FM band, in which the present tuner is designed to operate, the frequency is sufficiently high (88–108 megahertz) that high frequency discrete transistors give better performance per unit of cost than general purpose devices formed by currently available integrated circuit processes. At this high frequency, it is recognized that oscillator drift is a problem that has to be dealt with by automatic control. The conventional circuit uses the collector barrier capacity of the oscillator transistor, which has a capacity dependent on the collector potential, or the emitter diffusion capacitance which depends on current. Assuming that the tuner is to be used in an AM-FM receiver, the tuner circuit should be readily switched on and off to suit the mode setting of the receiver. Performance considerations generally lead to more expensive circuitry, and accordingly once a certain performance plateau has been reached, the next objective is to achieve the same or nearly the same performance with simpler, less expensive circuits.

SUMMARY OF THE INVENTION:

Accordingly, it is an object of the present invention to provide an improved FM tuner for use in a radio receiver.

It is another object of the invention to provide an FM tuner having an improved automatic frequency control circuit.

It is still another object of the invention to provide an FM tuner for use in an AM-FM receiver which is readily enabled and disabled.

It is a further object of the invention to provide an FM tuner having an economic and simple design.

These and other objects of the invention are achieved in a novel tuner for converting radio frequency signals to a fixed intermediate frequency and designed for automatic frequency control. The combination comprises a first source of variable potentials for affecting automatic frequency control, a transistor mixer and a transistor oscillator connected in circuit together.

The mixer includes an input circuit comprising an r.f. transformer having a first winding tuned to resonance and coupled to a source of r.f. signals and an untuned, secondary winding connected to the base for coupling signals to the mixer and also for connecting the base electrode to the first source in a path of low d.c. impedance.

In a preferred form, the untuned secondary winding of the mixer input circuit has a moderately low r.f. impedance at FM frequency and a very low impedance at intermediate frequencies so as to reduce i.f. radiation into the antenna or i.f. pickup into the detector. The untuned secondary winding is nominally a single turn. The mixer output circuit is connected to the collector electrode and is tuned to the fixed intermediate frequency.

In a preferred form, the d.c. bias for both transistors is derived from and AFC source. In that form, the tuned mixer output circuit provides a single low d.c. impedance path between the collector of the mixer and the first source.

The oscillator has a by-pass capacitor for grounding the base of the oscillator transistor at the oscillator frequency, and a second source of d.c. potentials connected between the base and ground for forward biasing the oscillator input junction. The oscillator has a tuned resonant circuit which provides a single path of low d.c. impedance between the emitter of the mixer transistor and the collector of the oscillator transistor. This connection equalizes the currents between the transistors; transfers the voltage variations in the first source less the voltage drop in the input junction of the mixer transistor to the collector of the oscillator transistor; and provides oscillator injection into the mixer.

The oscillator circuit utilizes a tapped inductance coupled to the mixer emitter for oscillator injection. In its simplest form, the portion of the inductance below the tap consists of the lead and stray circuit inductance of a second capacitor used to provide the r.f. ground to the oscillator inductance. A resistance connected between the emitter of the oscillator transistor and ground sets the desired current levels in both transistors.

Regeneration is established by a second capacitor coupled between the collector and emitter of the oscillator transistor. The second capacitor and the emitter connected resistance govern the amount of feedback.

The tuner may be readily turned off and on, independently of the balance of the radio receiver, by a single switch controlling the potential applied to the base of the oscillator transistor.

BRIEF DESCRIPTION OF THE DRAWING

The novel and distinctive features of the invention are set forth in the claims appended to the present application. The invention itself, however, together with further objects and advantages thereof may best be understood by reference to the following description and the accompanying drawing.

The drawing shows the circuit diagram of an FM tuner in accordance with the invention incorporated in a radio receiver whose principal parts are shown in block diagram form.

DESCRIPTION OF A PREFERRED EMBODIMENT

An FM tuner embodying the present invention is shown in the drawing. The FM tuner is a portion of a radio receiver designed to accept signals at a radiated frequency, select one such signal and convert it to a fixed intermediate frequency. The radiated frequency is one of a number of frequencies allocated for transmission and lying within a specified band. In the case of FM broadcasting, the band extends from 88.1 to 107.9 megahertz and frequencies are allocated for use at 200 KC intervals. The fixed intermediate frequency to which the radiated signals are converted is typically 10.7 megahertz. The tuner in FIG. 1 is designed to accept signals directly from an antenna or from a prior radio frequency amplifier stage and to couple a selected signal at the intermediate frequency to an intermediate frequency amplifier 11. The signal is then processed in the IF amplifier, the detector 12 and audio 13 circuits, which form the following signal handling portions of the radio receiver. Other portions of the radio receiver provide means for enabling or disabling the FM tuner, mechanical means for traversing the tuner's tuning range, bias potentials to operate the tuner, and automatic frequency control potentials for reducing drift.

The present FM tuner may be characterized by the fact that the two transistors in the mixer and in the oscillator circuits, are connected in circuit together. The tuner consists of a mixer, oscillator and an IF output circuit from which the selected signal at the intermedite frequency is derived.

The mixer and IF output circuitry are shown at the upper half of the drawing. The mixer consists of the transistor Q1, the tuned antenna circuit consisting of inductively coupled inductors L1, L2 and L3, the variable, adjustable and fixed capacitors, C1A, C1E and C2, respectively, decoupling resistance R1, and by-pass capacitor C3.

The mixer input circuit is connected as follows: The inductor L1 is a coil of a few turns (three typically) having one end connected to the FM antenna and the other end grounded. The inductor L1 is arranged with its grounded end adjacent to a second inductor L2. Inductor L2 is a high Q coil of a few turns (three typically); having the end adjacent to L1 grounded. The inductor L1 may be regarded as the antenna matching element and loosely couples the antenna to the inductor L2. The remote end of inductor L2 is coupled to on plate of each of the capacitors C1A, C1E and C2. Since each of the capacitors C1A, C1E and C2 has a second plate which is grounded, they are electrically in parallel with the inductor L2. Together the capacitors (C1A, C1E and C2) and inductor (L2) form a variable frequency parallel resonant circuit for station selection. The values of L2 and C1A, C1E and C2 are selected to provide a tuning range over the FM band. Customarily, the mechanism for tuning the "main tuning" capacitor (C1A) is a single manually operated control, which also operates the tuning capacitor of the FM local oscillator and the tuning capacitors of an AM tuner, if one is provided.

Continuing with the mixer input circuit, a third single turn inductor L3 is provided, spaced closely adjacent the ungrounded end of the inductor L2. The inductor L3 has one end coupled to the base of the mixer transistor Q1. The other end of inductor L3 is coupled to ground by by-pass capacitor C3, which has a low impedance at RF and IF frequencies. The other end of L3 is also connected through decoupling resistance R1 to terminal pin 16, to which a source 14 of combined bias and AFC potentials is applied. The inductor L3 is a single turn winding designed to be of high Q, loosely coupled to L2, and forming a tertiary winding for coupling signals selected by the tuned circuit to the base of Q1.

The inductor L3, being a single turn winding, presents a medium impedance (50–100) at the FM band (100 MHz), and a proportionately lower impedance at the IF frequency 10.7 MHz). This has the very useful advantage of reducing the amount of mixer radiation at the intermediate frequency back into the antenna.

The mixer transistor Q1 is connected in the base input-emitter common configuration. The selected signal is applied to its base by the tertiary winding L3, previously noted. Local oscillations are coupled to its emitter, as will shortly be described and the heterodyned output signal is derived from its collector by means including the IF output circuit, which will now be described.

The IF output circuit consists of two parallel resonant circuits (T1 and T2) mutually coupled by C4. The tuned circuit T1 consists of an inductor and a capacitor connected in parallel and tuned to resonate at the 10.7 MHz IF frequency. The collector of Q1 is coupled to one terminal of the parallel resonant circuit T1. The other terminal of T1 (remote from the collector of Q1) is connected through decoupling resistance R1 to the source 14 and bypassed to ground by capacitor C3. Collector current for Q1 flows through the inductor of T1 and capacitor C3 holds the "other" terminal of T1 at radio frequency ground.

The second tuned circuit (T2) of the IF output circuit, is coupled to the first tuned circuit T1 by a small (5 pica farad) capacitor C4. The second tuned circuit T2 takes the form of a transformer having a tuned primary and an untuned secondary. The primary consists of a parallel resonant inductor and capacitor tuned to the IF frequency. The secondary is designed to be coupled to the base of the input transistor of the following IF amplifier 11. The tuned primary circuit of T2 has one terminal coupled through C4 to the collector of Q1 to T1, and the other terminal grounded. The illutrated IF output circuitry is designed to provide sufficient selectivity to permit use of a broad band amplifier for IF amplification having only one additional tuned circuit at the point where the amplified IF signal is applied to the input of the FM detector. In the event that less selectivity is required at the input to the IF amplifier, as when interstage filtering is employed, tuned circuit T2 and C4 may be removed and T1 provided with an untuned secondary for coupling to the following If amplifier.

For reasons that will be elaborated below, both the collector of Q1 (through tuned circuit T1) and the base of Q1 (through inductor L3) and d.c. connected to resistance R1 in the current path to the bias source 14.

The FM local oscillator, which injects oscillations into the emitter of mixer transistor Q1, is shown at the lower portion of the figure. It consists of oscillator transistor Q2, tank circuit (L4, L5, C1F, C1B, C5, C6), feedback capacitor C7, emitter resistance R2, bypass capacitor C8, and the control switch SW1.

The oscillator transistor Q2 is connected in a common base oscillatory circuit with regenerative feedback from collector to emitter and a collector connected tank circuit. The base of transistor Q2 is bypassed to ground by capacitor C8.

Regenerative feedback for the oscillator is provided by a network including the capacitor C7 and resistor R2 (and the transistor impedance at the emitter). The capacitor C7 is coupled between the collector and emitter of Q2. The resistor R2 is coupled between the emitter of Q2 and ground. The capacitor C7 couples oscillations in regenerative phase to the emitter developing a regenerative current in load resistance R2 to sustain oscillation. The emitter load resistance R2 also establishes the d.c. current level of transistor Q2, and as will be explained, the d.c. level of transistor Q1 as well. The current is normally set at approximately 1 milliampere.

The oscillator tank circuit is a resonant circuit consisting of an inductance paralleled by a capacitance. The inductance consists of the inductor L4, a high Q coil of three turns and a small virtual inductance L5 in series with it. Inductor L5 consists of the inductance of the leads and printed circuit paths associated with by-pass capacitor C5. One end of inductor L4 is coupled to the collector of oscillator transistor Q2, while the other end is coupled to the emitter of mixer transistor Q1. Capacitor C5 has a low capacitive reactance at the local oscillator frequency and provides a radio frequency ground to the series inductances (L4, L5). The capacitance in the parallel resonant circuit consists of main tuning capacitor C1B, trimming capacitor C1F and a fixed capacitor C6, all paralleled. Each capacitor has one terminal coupled to the collector of Q2 and each has the other terminal grounded, thus paralleling the capacitors C1F, C1B and C6 with the series connected inductors L4, L5.

Local oscillations are injected into the emitter of mixer transistor Q1 from a tap on the inductance in the oscillator tank circuit. As previously noted, the inductance of the oscillator tank circuit consists of inductor L4 in series with virtual inductance L5. The inductance of L5 is substantially smaller than the inductance of L4 and thus provides a step down of the total tank inductance for the emitter of Q1 coupled only across L5. The step down reduces the loading on the tank circuit and allows the oscillator to operate at a higher Q.

The mixer and local oscillator are tuned together over the FM band to form heterodynes at the intermediate frequency. For this purpose, the main tuning capacitor of the mixer (C1A) has a common shaft with the main tuning capacitor of the oscillator (C1B) causing them to be adjusted together. Not only must they be adjusted together but the frequency separation of their respective tuned circuits must be held substantially constant and close to the correct value. The frequency separation between the two tuned circuits, assuming an FM station is present at the tuned frequency, defines the heterodyne or output frequency of the mixer. This heterodyne frequency must equal the frequency to which the intermediate frequency filters are tuned. The auxiliary capacitors (C1E, C2 and C1F, C6) adjust the tuning rates of the mixer and oscillator so that they "track" at the desired intermediate frequency.

The tuner is conveniently and positively turned on and off by the switch SW1 associated with the base electrode of Q1. As shown in FIG. 1, the transistors Q1 and Q2 are connected conventionally so that their currents flow in a single series path from the bias source 14 to ground. This path includes the mixer decoupling resistor R1 coupled to source 14, the inductor of tuned circuit T1, the collector to emitter current path through transistor Q1, inductor L4 connected between the emitter of Q1 and the collector of Q2 the collector to emitter current path through Q2 and finally the resistance R2 coupling the emitter of Q2 to ground. Since the current flow in the transistors Q1 and Q2 are constrained to be equal, turning transistor Q2 off also turns transistor Q1 off. Similarly, turning Q2 on turns Q1 on. The currents in transistor Q1 and Q2 are controlled by switch SW1. The base of Q2 is connected to the movable contact of switch SW1. The stationary contacts of switch SW1 are respectively connected to a small (1.2 volt) positive d.c. source 17 and to ground. When the moving contactor of switch SW1 is in the grounded position, the input junction of Q2 is biased cutting off the currents in both transistors. When the moving contactor is connected to source 17, the input junction of Q2 is forwardly biased and both transistors are turned on and conduct at the current level established by R2. This biasing method, assuming the voltage of source 17 to be stable, has the advantage of making the tuner current independent of the beta of either transistor Q1 or Q2, and avoids the need to match the emitter resistor (R2) to the beta of the transistor to achieve a desired operating current level. The source 17 may take the form of a pair of series connected diodes forward biased by a source of higher d.c. potentials and including current at a level set by a series connected resistance. The source may also be a portion of the circuitry associated with the other portion of the radio receiver.

The automatic frequency control voltage is applied to the oscillator circuit from source 14. As previously noted, the bias and AFC voltages are combined in source 14. The source 14 supplies collector bias at approxiamtely ±½ volt swing. The ±½ volt swing is attributable to an automatic frequency voltage derived from detector 12. It is dependent on an averaged frequency offset in the received FM signal from the center frequency of the IF pass band. The tuning of the FM detector 12 establishes this center frequency of the IF pass band. The output of FM detector 12 is averaged, and coupled to source 14 to control its output in responce to the frequency offset. Source 14 may take the form of a conventional transistor current source. When an FM station is properly tuned in, the detected frequency offset is small and the output potential of source 14 approximates 2.4 volts. In all conditions, the source 14 provides adequate bias for operating Q1 and Q2.

The AFC action of the present circuit is very sensitive. In a cascode circuit, one might expect any reduction in collector bias to the series connected transistors to be equally divided. In the present circuit, any change in potential at the source terminal (pad 16) is applied almost entirely across the local oscillator Q2 where it may be used to maximum effect in controlling the oscillator tuning. As previously noted, the collector of Q1 is conductively connected through the T1 inductor and R1 to source 14. The base of Q1 is connected through the low d.c. impedance inductor L3 to the interconnection between R1 and T1. This connection holds the base of Q1 at zero d.c. bias with respect to the collector of Q1. Since the potential on the emitter of Q1 is held at a relatively stable Vbe drop below the base of Q1, the collector of Q2 coupled to the emitter of Q1 through the low impedance inductor L4 is likewise held at the same Vbe drop below source 14. Accordingly, when the potential at pin 16 varies, substantially the entire variation in potential appears at the collector of Q2.

Automatic frequency control is accomplished by changing the collector base barrier capacitance of Q2. The circuit as so far described maintains the emitter current of Q2 at a nearly constant value, while the collector voltage of Q2 is caused to vary directly with the AFC voltage from source 14. For higher source voltage (V14), the collector barrier capacitance ($C_{CB2}$) will be low causing a higher local oscillator frequency. Conversely, when V14 is low, $C_{CB2}$ will be high, causing a lower local oscillator frequency. With a typical discriminator circuit, 1 volt of variation is available and the tuning range should be about 1 megahertz. Since most of the change in V14 voltage appears across the collector base junction of Q2, the circuit operates very sensitively, permitting a high frequency device ($f_t$ approximating 600 MHz) to be used. Using a prior design in which approximately half of the V14 voltage appeared across the junction, the same capacitance change required a lower frequency device ($f_t$ approximating 200 MHz). The ability of the foregoing cascode circuit to use a higher $f_t$ device improves the oscillator start up margins and thereby the overall circuit reliability.

The foregoing FM tuner circuit is particularly economical since it avoids the need for approximately a dozen parts over that of a more straight-forward design. For instance, the resistance R2, which is used to establish the currents in both transistors Q1 and Q2 and the a.c. feedback ratio for Q2 avoids the need for three resistances and usually an additional capacitor or two. Capacitor C5 serves two functions avoiding the need for an additional inductor. It functions as the ground bypass capacitor for the oscillator tank circuit and its leads serve as an inductance for step down injection into the mixer circuit. The use of the single turn base line (L3) to the mixer of Q1 avoids the need for an additional IF trap to avoid radiation into the antenna or IF pickup by the antenna circuit into the mixer base. The derivation of collector bias and AFC voltage from a single source permits use of a single bus and avoids the need for a second resistor-capacitor decoupling network.

The foregoing FM tuner gives about 12 db of conversion gain. This represents a 6 db improvement over common commercial tuners. The added gain tends to improve the limiting action of a radio receiver having limited IF gain, during the reception of weak signals.

The tuner may take other forms. For instance, in the antenna circuit, the primary winding L1 may be eliminated and the antenna coupled through a small capacitance to the ungrounded terminal of L2. A second circuit variation involves the separation of the sources for AFC and the bias potentials. In particular, the base link L3 may be returned to the AFC source while the tuned circuit T1 is returned to a separate B+ source. This would reduce the current load on the AFC source to the base current of Q1. As noted earlier, this arrangement has the disadvantage of requiring an additional decoupling network. However, this circuit variation would still continue other design economies. In particular, the AFC action would be transferred with a constant offset to the collector of oscillator transistor Q2, and the current in Q1 and Q2 and the feedback ratio would still be determined by R2.

What we claim as new and desire to secure by Letters Patent of the United States is:

1. In a tuner for converting radio frequency signals to a fixed intermediate frequency and designed for automatic frequency control, the combination comprising:
   1. a first source of variable potentials for effecting automatic frequency control,
   2. a mixer including:
      a. a first transistor having base, emitter and collector electrodes,
      b. an input circuit for said mixer comprising an r.f. transformer having a first winding tuned to resonance and coupled to a source of r.f. signals; and an untuned, secondary winding connected to said base electrode for coupling signals thereto, and connecting said base electrode to said first source in a path of low d.c. impedance,
      c. a mixer output circuit connected to said collector electrode and tuned to said fixed intermediate frequency for deriving signals at the intermediate frequency,
   3. an oscillator comprising:
      a. a second transistor connected in circuit with said first transistor having base, emitter and collector electrodes,
      b. a bypass capacitor for grounding the base of said second transistor at the oscillator frequency,
      c. a second source of d.c. potentials connected between the base electrode of said second transistor and ground,
      d. a tuned resonant circuit for said oscillator providing a single path of low d.c. impedance between the emitter of said first transistor and the collector of said second transistor to equalize the currents between said transistors to transfer the voltage variations in said first source less the voltage drop in the input junction of said first transistor to the collector of said second transistor, and to provide oscillator injection into said mixer, and
      e. a resistance connected between the emitter of said second transistor and ground for setting the desire current levels in both said transistors.

2. The combination set forth in claim 1 wherein: means are provided for applying regenerative feedback to said second transistor to sustain oscillations, said means including a second capacitor coupled between the collector and emitter of said second transistor and said emitter connected resistance, the values of said second capacitor and said resistance controlling the amount of feedback.

3. The combination set forth in claim 2 wherein: said first source provides d.c. bias to said first and said second transistors, said tuned mixer output circuit being connected to provide a single path of low d.c. impedance between the collector of said first transistor and said first source.

4. The combination set forth in claim 3 wherein: the tuned circuit of said oscillator is a parallel resonant circuit comprising an inductance in parallel with a capacitance and wherein said inductance has a tap from which oscillations are injected into the emitter of said first transistor.

5. The combination set forth in claim 4 wherein a first portion of said inductance on one side of said tap is connected between the collector of said second transistor and the emitter of said first transistor, and wherein a second capacitor is provided coupling a second portion of said inductance on the other side of said tap to ground.

6. The combination set forth in claim 5 wherein said second inductance portion consists of the lead and stray circuit inductance associated with said second capacitor.

7. The combination set forth in claim 6 wherein said untuned secondary winding of said input circuit has a moderately low r.f. impedance selected to provide adequate conversion gain at signal frequencies and a low impedance at intermediate frequencies to reduce IF radiation or IF pickup.

8. The combination set forth in claim 7 wherein said untuned secondary winding is a nominal single turn winding.
9. The combination set forth in claim 1 wherein means are provided for enabling and disabling said tuner comprising:
a switch for selectively applying said second source, having a movable contactor coupled to the base electrode of said second transistor and designed to a contact one of two stationary contacts, the first stationary contact being coupled to said second source, and the second stationary contact being grounded.

* * * * *